United States Patent [19]

Tanaka

[11] Patent Number: 5,363,277
[45] Date of Patent: Nov. 8, 1994

[54] STRUCTURE AND METHOD FOR MOUNTING SEMICONDUCTOR DEVICE

[75] Inventor: Osamu Tanaka, Kyoto, Japan

[73] Assignee: Rohm Co., Ltd., Kyoto, Japan

[21] Appl. No.: 991,177

[22] Filed: Dec. 16, 1992

[30] Foreign Application Priority Data

Dec. 20, 1991 [JP] Japan ................... 3-355877

[51] Int. Cl.$^5$ ............................................. H05K 7/02
[52] U.S. Cl. ................... 361/760; 361/743;
361/750; 361/767; 174/52.1; 174/138 G;
257/779; 257/783
[58] Field of Search ............... 361/395, 396, 397, 400,
361/401, 402, 403, 417, 418, 419, 420, 743, 746,
748, 750, 751, 760, 761, 767; 174/52.1, 52.4,
255, 259, 260, 138 G; 257/700, 779, 780, 782,
783

[56] References Cited

U.S. PATENT DOCUMENTS 5,225,966 7/1993 Basavanhally ................. 361/406

FOREIGN PATENT DOCUMENTS 60-49638 3/1985 Japan .
1142750 6/1986 Japan .
1145838 7/1986 Japan .

Primary Examiner—Leo P. Picard
Assistant Examiner—Young Whang
Attorney, Agent, or Firm—Brumbaugh, Graves, Donohue & Raymond

[57] ABSTRACT

The structure and method for mounting a semiconductor device, in which a wiring pattern 2 on a circuit substrate 1 and projection electrodes 5 of an integrated circuit 4 are made to be in opposition to and connected to each other, the wiring pattern 2 is connected to the projection electrodes 5 while penetrated through an adhesive and thermosetting thin film member 3 covering the wiring pattern 2; and the integrated circuit 4 is held onto the circuit substrate 1 by a hardening force of the adhesive and thermosetting thin film member 3.

5 Claims, 2 Drawing Sheets

STRUCTURE AND METHOD FOR MOUNTING SEMICONDUCTOR DEVICE

BACKGROUND OF THE INVENTION

The present invention relates to a semiconductor device mounting structure and a semiconductor device mounting method.

Conventionally, as the semiconductor device mounting structure and semiconductor device mounting method, an integrated circuit 14 is held on a circuit substrate 11 by using a liquid adhesive 13A or a sheet-like adhesive 13b provided in a wiring pattern 12 on the circuit substrate 11 as shown in FIGS. 5 to 7.

In the case of using the liquid adhesive 13A, however, there has been a problem that the adhesive 13A drops, becomes dirty, or spreads because of its liquid state and therefore it is difficult to control the arrangement position of the liquid adhesive 13A. Further, there has been another problem that maintenance is troublesome because it is necessary to clean the adhesion portion, etc.

In the case of using the sheet-like adhesive 13B, on the other hand, if the sheet-like adhesive 13B is erroneously provided on the wiring pattern 12, connection between the projection electrodes 15 and the wiring patterns 12 is hindered by glass fibers, a film, paper, or the like which are provided as the core in the adhesive 13B to thereby cause defective connection. It is therefore necessary to work the sheet-like adhesive 13B to have such a shape that the adhesive 13B is accommodated within the wiring pattern 12 and it is necessary to carefully stick the adhesive 13B so that the adhesive 13B is accommodated within the wiring pattern as shown in FIG. 7. This is a cause of reduction in working efficiency.

SUMMARY OF THE INVENTION

The present invention has been attained in view of the above problems in the prior art and an object of the present invention is to provide a semiconductor device mounting structure and a semiconductor device method, so that an integrated circuit can be easily provided on a circuit substrate.

According to the present invention, the semiconductor device mounting structure in which a wiring pattern on a circuit substrate and projection electrodes of an integrated circuit are made to be in opposition to and connected to each other, wherein it is connected between the wiring pattern and the projection electrodes while penetrating through an adhesive and thermosetting thin film member covering the wiring pattern; and the integrated circuit is held onto the circuit substrate by a hardening force of the adhesive and thermosetting thin film member.

According to the present invention, the semiconductor device mounting method in which a wiring pattern on a circuit substrate and projection electrodes of an integrated circuit are made to be in opposition to and connected to each other, the method comprises the steps of: sticking an adhesive and hardenable thin film member on the circuit substrate so as to cover the wiring pattern; connecting the projection electrodes of the integrated circuit to the wiring pattern while penetrating through the adhesive and hardening thin film member; and hardening the adhesive and hardenable thin film member to thereby hold the integrated circuit on the circuit substrate.

In the semiconductor device mounting structure and semiconductor device method according to the present invention, projection electrodes are connected to a wiring pattern while penetrating through an adhesive and hardenable thin film member provided on the wiring pattern. It is therefore not necessary to provide the adhesive and hardenable thin film member within the wiring pattern and it is not necessary to make the shape of the thin film member to be accommodated within the wiring pattern.

BRIEF DESCRIPTION OF PREFERRED EMBODIMENT

DESCRIPTION OF PREFERRED EMBODIMENT

Figure 1:
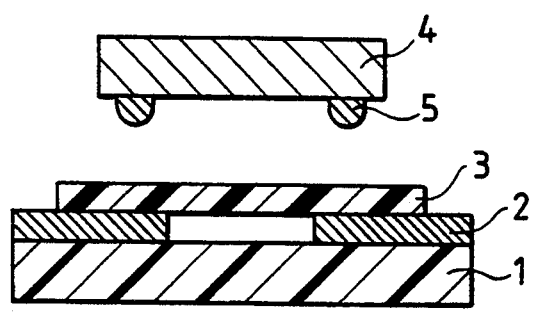
FIG. 1 is a diagram for explaining the state where an integrated circuit is set on a circuit substrate.

Next, the present invention will be described with reference to the accompanying drawings.

FIGS. 1 through 4 are diagrams for explaining the mounting steps according to the present invention. In the drawings, the reference numeral 1 designates a circuit substrate; 2, a wiring pattern; 3, an adhesive and hardenable thin film member; 4, an integrated circuit; and 5, projection electrodes.

The circuit substrate 1, the wiring pattern 2, the integrated circuit 4, and the projection electrodes 5 are the same as conventional ones and therefore detailed description about the configuration thereof is omitted.

Figure 2:
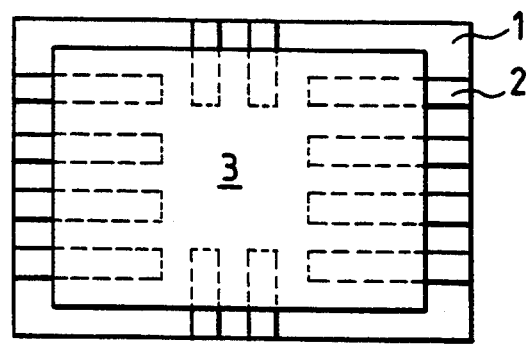
FIG. 2 is a diagram for explaining the state where the adhesive and hardenable thin film member is stuck so as to cover the wiring pattern on the circuit substrate.

The adhesive and hardenable thin film member 3 is made, for example, of a material prepared by working thermosetting epoxy resin or photosetting UV resin. The thin film member 3 has no core portion such as a film, glass fibers, or the like so that the projection electrodes 5 can contact with the wiring pattern 2 while penetrating through the thin film member 3. The size of the thin film member 3 is suitably determined in accordance with the respective sizes of the wiring pattern 2 and the integrated circuit 4, and it is preferable to select the size so that the thin film member 3 can cover the wiring pattern 2 as shown in FIG. 2. Further, the thickness of the film member may be selected so that the projection electrodes 5 can contact with the wiring pattern 2 while penetrating through the thin film member 3. Specifically, the film thickness may be selected to be 7–50 $\mu$m when the size of the projection of each of the projection electrodes 5 is 5–30 $\mu$m.

Referring to FIGS. 1 through 4, the mounting method according to the present invention will be described hereunder.

Step 1: the adhesive and hardenable thin film member 3 is stuck on the wiring pattern 2 (FIG. 1). If the size of the thin film member 3 is selected to be considerably larger than that of the integrated circuit 4, no problem is caused in mounting the integrated circuit 4 even if the sticking position is slightly displaced. (FIG. 2).

Figure 3:
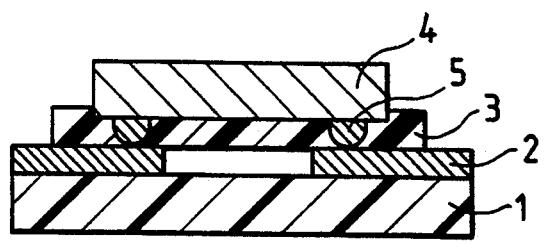
FIG. 3 is a diagram for explaining the state where the integrated circuit is urged against the circuit substrate.
Figure 4:
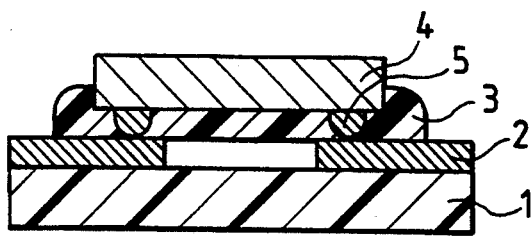
FIG. 4 is a diagram for explaining the state where the adhesive and hardenable thin film member has been hardened.
Figure 5:
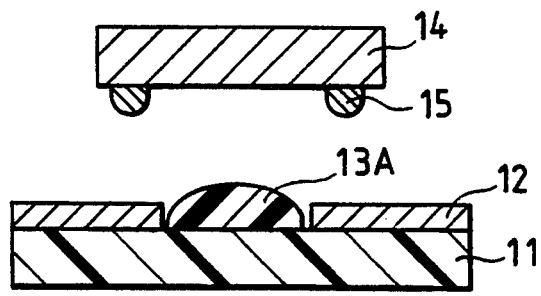
FIG. 5 is a diagram for explaining an example of the conventional fixing method.
Figure 6:
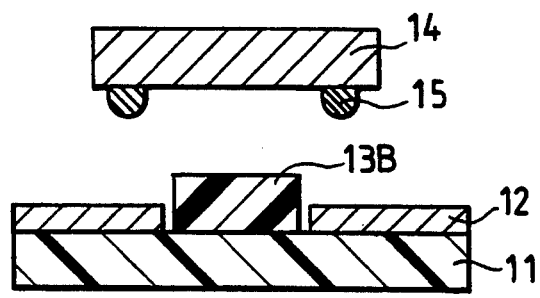
FIG. 6 is a diagram for explaining another example of the conventional fixing method.
Figure 7:
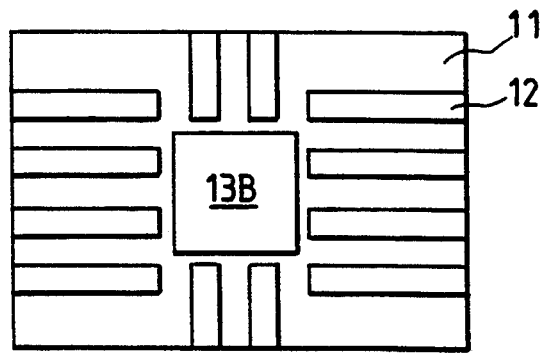
FIG. 7 is a diagram for explaining the state where a sheet-like adhesive of FIG. 6 is stuck on a circuit substrate.

Step 2: The integrated circuit 4 is urged against the circuit substrate 1 and the projection electrodes 5 are made to penetrate through the thin film member 3 to come into contact with the wiring pattern 2 (FIG. 3).

step 3: The thin film 3 is hardened so that the integrated circuit 4 is fixedly held and the ohmic contact between the projection electrodes 5 and the wiring pattern 2 is made sure (FIG. 4). Hardening is carried out by heating in the case of using thermosetting epoxy resin as the thin film member 3, and, on the other hand, hardening is carried out by exposing an ultraviolet light by an ultraviolet lamp in the case of using photosetting UV resin as the thin film member 3.

As described above, according to the present invention, the tolerance of the adhesive and hardenable thin film member in sticking is so large that the work becomes easily and the workability is improved. Further, since the adhesive and hardenable thin film member has no core, no defective connection is cause between projection electrodes and a wiring pattern.

What is claimed is:

1. A structure for mounting a semiconductor device, in which a wiring pattern on a circuit substrate and electrodes projecting from an integrated circuit are supported in opposition to and electrically connected to each other, comprising
    an integrated circuit having projecting electrodes,
    a circuit substrate having a wiring pattern and
    an adhesive and hardenable thin film member extending between and in adhesive contact both with the circuit substrate and with the integrated circuit to adhesively hold the integrated circuit onto the circuit substrate with the projecting electrodes extending through the adhesive and hardenable thin film member so as to be held in electrical contact with the wiring pattern in the circuit substrate.

2. A structure for mounting a semiconductor device as claimed in claim 1, wherein said adhesive and hardenable thin film member is made of one of thermosetting epoxy resin and photosetting UV resin.

3. A method for mounting a semiconductor device in which a wiring pattern on a circuit substrate and electrodes projecting from an integrated circuit are supported in opposition to and electrically connected to each other, comprising the steps of:
    applying an adhesive and hardenable thin film member to a circuit substrate so as to cover a wiring pattern on the circuit substrate;
    pressing the integrated circuit and the circuit substrate together to cause the adhesive and hardenable thin film member to adhesively contact both the integrated circuit and the circuit substrate and to produce adherence between them and to cause the electrodes projecting from the integrated circuit to extend through the adhesive and hardenable thin film member and engage the wiring pattern; and
    hardening said adhesive and hardenable thin film member to cause the integrated circuit to be affixed to the circuit substrate.

4. A method for mounting a semiconductor device as claimed in claim 3, wherein the adhesive and hardenable thin film member is an epoxy resin and the hardening is carried out by heating.

5. A method for mounting a semiconductor device as claimed in claim 3, wherein the adhesive and hardenable thin film member is a photosetting UV resin and the hardening is carried out by exposing the member to an ultraviolet light.

* * * * *